United States Patent [19]
Brown et al.

[11] Patent Number: 5,326,671
[45] Date of Patent: Jul. 5, 1994

[54] METHOD OF MAKING CIRCUIT DEVICES COMPRISING A DIELECTRIC LAYER OF SILOXANE-CAPROLACTONE

[75] Inventors: Paula J. Brown, Cream Ridge; Treliant Fang, Lawrenceville, both of N.J.; Jose A. Ors, New Hope, Pa.; Venkataram R. Raju, New Providence, N.J.; Akshay V. Shah, Londonberry, N.H.

[73] Assignee: AT&T Bell Laboratories, Murray Hill, N.J.

[21] Appl. No.: 997,058

[22] Filed: Dec. 28, 1992

[51] Int. Cl.$^5$ .................................. G03C 5/00
[52] U.S. Cl. ................... 430/311; 430/313; 428/901; 428/209
[58] Field of Search ............. 430/17, 280, 286, 920, 430/287, 14, 314, 315, 322, 311; 428/901, 209; 361/412, 397; 174/68.5

[56] References Cited
U.S. PATENT DOCUMENTS 4,296,171  10/1981  Imai ........................ 428/339
4,554,229  11/1985  Small ........................ 430/17

Primary Examiner—Steve Rosasco
Attorney, Agent, or Firm—Roderick B. Anderson

[57] ABSTRACT

A triazine-based mixture, used as a multichip module device dielectric (14), is made more robust and more resistant to temperature extremes by making it to be of from twenty to sixty percent by weight of triazine and of one to ten percent by weight of siloxane-caprolactone copolymer. The foregoing mixture can be made to have a higher resolution by including zero to twenty percent by weight of novolak epoxy acrylate. The entire mixture preferably additionally comprises two to eight percent by weight of bisphenol-A diglycidyl ether monoepoxyacrylate, zero to twenty percent by weight of carboxyl-terminated butadiene nitrile rubber, two to six percent of N-vinylpyrrolidone, one to ten percent of trimethylolpropanetriacrylate, zero to five weight percent glycidoxypropyltrimethoxysilane, 0.05 to five weight percent photoinitiator, zero to two percent pigment, 0.1 to one percent surfactant, zero to 0.3 percent copper benzoylacetonate, and thirty to fifty percent solvent.

8 Claims, 1 Drawing Sheet

FIG. 6   REPEAT STEPS OF FIGS. 3 THRU 5

METHOD OF MAKING CIRCUIT DEVICES COMPRISING A DIELECTRIC LAYER OF SILOXANE-CAPROLACTONE

TECHNICAL FIELD

This invention relates to devices using photodefinable polymers, and, more particularly, to improve photodefinable polymer compositions for use in multilayer devices.

BACKGROUND OF THE INVENTION

The U.S. patent of Small, U.S. Pat. No. 4,554,229, granted Nov. 19, 1985, describes a multilayer hybrid integrated circuit comprising photodefinable polymer dielectric layers. Such layers can be formed over a conductor pattern and then patterned by selective exposure to actinic light and development. Microvia holes in the dielectric may, for example, be formed, which are then used to permit interconnection of a conductor pattern on the upper surface of the dielectric layer with the conductor pattern it overlies. Multiple layers can be successively formed in this manner with each interconnection pattern being used to interconnect a number of semiconductor chips. The overall structure may constitute, for example, a multilayer hybrid integrated circuit, multichip module (MCM), or other packages which can provide high density interconnection of a number of complex chips with relatively low loss.

One problem with the dielectric of the Small patent is that it is susceptible to cracking when subjected to temperature extremes. This problem becomes more severe as density requirements dictate an increase in the number of layers. For example, a four layer test circuit may show signs of cracks after fifty temperature cycles of from −40° C. to 150° C. It would also be desirable to increase the resolution with which the photodefinable dielectric film responds to actinic light.

SUMMARY OF THE INVENTION

A triazine-based mixture of the general type described in the Small patent, i.e., a photodefinable triazine-based mixture including a photosensitive acrylate moiety, is made more robust and more resistant to temperature extremes by making it to be of from twenty to sixty percent by weight of triazine and of one to ten percent by weight of siloxane-caprolactone copolymer.

The foregoing mixture can be made to have a higher resolution by including up to twenty percent by weight of novolak epoxy acrylate.

The entire mixture preferably additionally comprises two to eight percent by weight of bisphenol-A diglycidyl ether monoepoxyacrylate, zero to twenty percent by weight of carboxyl-terminated butadiene nitrile rubber, two to six percent of N-vinylpyrrolidone, one to ten percent of trimethylolpropanetriacrylate, zero to five weight percent glycidoxypropyltrimethoxysilane, 0.05 to five weight percent photoinitiator, zero to two percent pigment, 0.1 to one percent surfactant, zero to 0.3 percent copper benzoylacetonate, and thirty to fifty percent solvent. A dielectric polymer layer made from this mixture has better resolution and film integrity than the dielectric of the Small patent. These and other objects, features and benefits will be better understood from a consideration of the following detailed description taken in conjunction with the accompanying drawing.

BRIEF DESCRIPTION OF THE DRAWING

FIGS. 1–6 represent successive steps in forming a circuit device in accordance with an illustrative embodiment of the invention.

DETAILED DESCRIPTION

Figure 1:
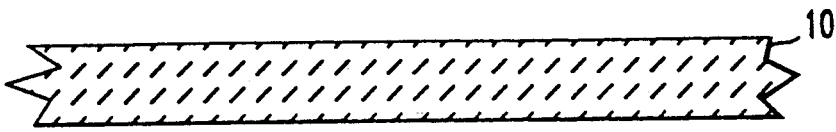
Figure 2:
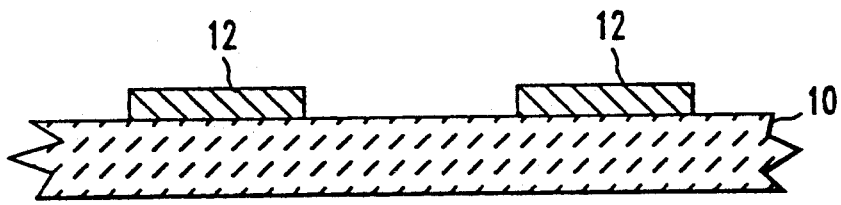

Referring to FIG. 1, there is shown schematically a ceramic substrate 10 upon which it is desired to form a hybrid integrated circuit by supporting and interconnecting a plurality of semiconductor chips. As shown in FIG. 2, a conductor pattern 12 is formed on an upper surface of a ceramic substrate by depositing a layer of metal and defining the metal by photolithographic masking and etching. The conductor pattern 12 may interconnect semiconductor chips on the upper surface of the ceramic substrate 10, which, for simplicity, are not shown.

Figure 3:
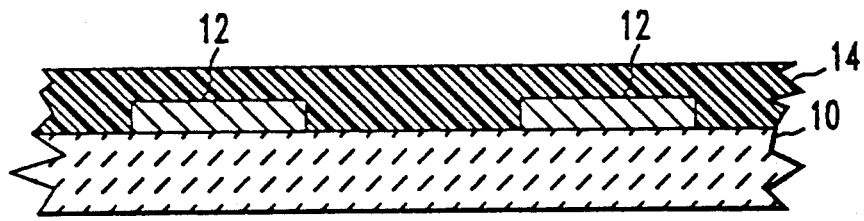
Figure 4:
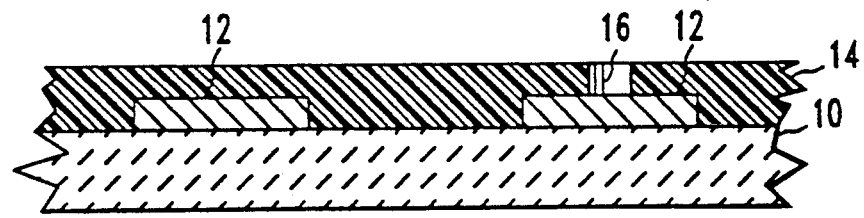

Referring to FIG. 3, over the conductor pattern 12 is next formed a photodefinable polymer layer 14 which, as described in the aforementioned Small patent, is a triazine-based polymer including a photosensitive acrylate moiety. The polymer may be typically be initially spray coated on the surface to a thickness of one to three mils, and thereafter baked at fifty-five degrees Centigrade for two hours to form an appropriate morphology. The polymer layer 14 is next exposed to actinic light on all areas in which it is desired that the layer maintain its integrity. Areas that are not so exposed are eventually removed. The film may be exposed to light centered at three hundred sixty-five nanometers at a power of twenty to forty milliwatts per square centimeter. Exposure to the light cures and solidifies the polymer layer. Referring to FIG. 4, the layer 40 is next developed by spraying on a solvent material such as butyl butyrate which is capable of selectively dissolving areas such as 16 which have not been exposed to light, and which therefore have not been cured or solidified to the same extent as the exposed areas.

Figure 5:
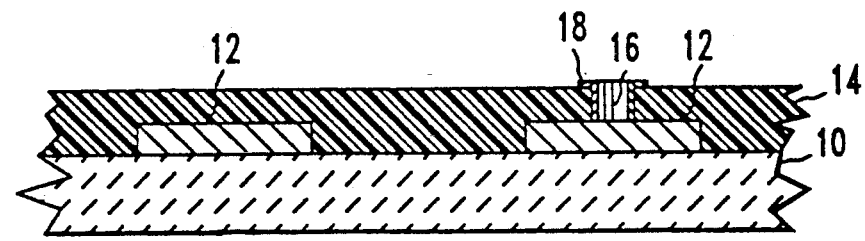

Referring to FIG. 5, a conductor pattern 18 is next formed on the upper surface of dielectric layer 14. As shown, the opening 16 may then constitute a conductive via to permit selective interconnection of conductor pattern 18 with conductor pattern 12. As before, various semiconductor chips may also be supported on the upper surface of dielectric layer 14 and interconnected by conductor pattern 18. As indicated in FIG. 6, the steps of FIGS. 3–5 may be repeated to establish a multiplicity of layers of conductor patterns each separated by a dielectric layer. With the dielectric layer being a photodefinable polymer, the various layers can be interconnected by conductive vias made as described above.

As pointed out in the Small patent, a photodefinable dielectric must meet a number of material requirements such as appropriate glass transition temperature ($T_g$), thermal stability, dielectric constant, metal compatibility, resolution, and leakage current. While the formula of the Small patent meets many of these requirements, and has been successfully used in commercial devices for several years, tests have shown that it is subject to deterioration, both mechanically and chemically, particularly under extreme temperature conditions. Specifically, a four layer test circuit has shown signs of cracks after fifty temperature cycles from −40° C. to one hundred fifty degrees Centigrade. Further, to accommodate higher density electronic circuits, it would be desirable to increase the photographic resolution of the material. For example, the resolution of the Small patent results in a minimum diameter for opening 16 of FIG. 4 of three mils; it would sometimes be desirable to make such openings to be less than three mils in diameter.

In accordance with the invention, the mixture from which polymer dielectric layer 14 is made comprises from twenty to sixty weight percent of triazine and from one to ten weight percent of siloxane-caprolactone copolymer, e.g., commercially available caprolactone dimethylsiloxane block copolymer. Silicone-caprolactone copolymer toughens the mixture and is advantageous because it has a significant compatibility range with triazine. In a preferred form, the siloxane-caprolactone block copolymer is end-capped with either acrylic acid to produce acrylate, or isocyanatoethyl methacrylate to produce urethane methacrylate. The end caps react photochemically during exposure which enhances resolution. The compatibility gives formulation latitude, and the toughening allows the final composite to endure temperature extremes without cracking.

Resolution is further enhanced by the addition of a small amount of a multifunctional oligomeric acrylate; specifically, the mixture is preferably made to comprise up to twenty weight percent of a novolak epoxy acrylate. The mixture already contains long-chain telechelic acrylates and short-chain acrylate monomers, but these alone are not sufficient to retain a rigid structure of the non-photoactive triazine resin during development. The novolak epoxy acrylate reacts in response to light to trap the dendritic molecular structure or "net" of the triazine resin. This gives the structure a sharper contrast at the interface of the exposed side and the non-exposed side. Thus, the resolution is increased and the minimum via aperture that can be produced is reduced from about three mils to about two mils.

The siloxane-caprolactone copolymer may or may not be in an acrylate form. The preferred formulations of the new triazine mixture in terms of ranges of values and apparent optimum values are as follows:

TABLE I

| Component | Weight % Range | Preferred Weight % |
|---|---|---|
| Triazine | 20–60 | 32.3 |
| Caprolactone Dimethoxysiloxane or Caprolactone Dimethoxysiloxane Urethane Methacrylate | 1–10 | 3.5 |
| Bisphenol-A Diglycidyl Ether Monoepoxyacrylate | 2–8 | 3.9 |
| Carboxyl-Terminated Butadiene Nitrile Epoxy Acrylate Rubber | 0–20 | 6.2 |
| N-vinylpyrrolidone | 2–6 | 4.1 |
| Trimethylolpropanetriacrylate | 1–10 | 3.6 |
| Novolak Epoxy Acrylate | 0–20 | 7.7 |
| Glycidoxypropyltrimethoxysilane | 0–5 | 1 |
| Photoinitiator | 0.05–5 | 1 |
| Pigment | 0–2 | 0.2 |
| Surfactant | 0.1–1 | 0.1 |
| Copper Benzoylacetonate | 0–0.3 | 0.2 |
| Solvent | 30–50 | 37 |

Methylethyl ketone (MEK), is a suitable solvent, although other solvents having a boiling point of seventy-five to one hundred fifty degrees Centigrade could be used. (It should be noted that the Small patent does not list the solvent as an ingredient, which distorts somewhat comparisons of the Small mixture with the mixture of Table I.) Specific examples of the inventive mixture which have been made and tested are given below:

Example I

| Component | Weight % |
|---|---|
| Triazine | 32.3 |
| Siloxane-Caprolactone Copolymer Urethane Methacrylate | 3.5 |
| Bis Phenol-A Diglycidyl Ether Monoepoxyacrylate | 3.9 |
| Carboxyl-Terminated Butadiene Nitrile Epoxy Acrylate Rubber | 6.2 |
| N-Vinylpyrrolidone | 4.0 |
| Trimethylolpropanetriacrylate | 3.6 |
| Novolak Epoxy Acrylate | 7.7 |
| Glycidoxypropyltrimethoxysilane | 1 |
| Isopropylthioxanthone/Ethyl Dimethylaminobenzoate | 0.13/0.24 |
| Pigment | 0.2 |
| FC 430 | 0.1 |
| Copper Benzoylacetonate | 0.2 |
| Methylethyl Ketone | 37 |

Example II

| Component | Weight % |
|---|---|
| Triazine | 36.5 |
| Siloxane-Caprolactone Copolymer Urethane Methacrylate | 4 |
| Bis Phenol-A Diglycidyl Ether Monoepoxyacrylate | 5.6 |
| N-Vinylpyrrolidone | 5.7 |
| Trimethylolpropanetriacrylate | 2.8 |
| Glycidoxypropyltrimethoxysilane | 1 |
| Igracure 651 | 0.9 |
| Pigment | 0.2 |
| FC 430 | 0.1 |
| Copper Benzoylacetonate | 0.2 |
| Methylethyl Ketone | 43 |

Example III

| Component | Weight % |
|---|---|
| Triazine | 32.3 |
| Siloxane-Caprolactone Copolymer Urethane Methacrylate | 3.3 |
| Bis Phenol-A Diglycidyl Ether Monoepoxyacrylate | 3.2 |
| Carboxyl-Terminated Butadiene Nitrile Epoxy Acrylate Rubber | 6.8 |
| N-Vinylpyrrolidone | 3.7 |
| Trimethylolpropanetriacrylate | 2.5 |
| Novolak Epoxy Acrylate | 6.3 |
| Glycidoxypropyltrimethoxysilane | 1 |
| Isopropylthioxanthone/Ethyl Dimethylaminobenzoate | 0.16/0.16 |
| Pigment | 0.2 |
| FC 430 | 0.1 |
| Copper Benzoylacetonate | 0.2 |
| Methylethyl Ketone | 40.1 |

Example IV

| Component | Weight % |
|---|---|
| Triazine | 32.3 |
| Siloxane-Caprolactone Copolymer Urethane Methacrylate | 3.3 |
| Bis Phenol-A Diglycidyl Ether Monoepoxyacrylate | 3.6 |
| Carboxyl-Terminated Butadiene Nitrile Epoxy Acrylate Rubber | 6.6 |
| N-Vinylpyrrolidone | 4.1 |
| Trimethylolpropanetriacrylate | 1.1 |
| Glycidoxypropyltrimethoxysilane | 1 |
| Isopropylthioxanthone/Ethyl Dimethylaminobenzoate | 0.17/0.17 |
| Pigment | 0.2 |
| FC 430 | 0.1 |

-continued

Example IV

| Component | Weight % |
| --- | --- |
| Copper Benzoylacetonate | 0.2 |
| Methylethyl Ketone | 47.2 |

The term FC 430 of all of the examples is a tradename for a surfactant available from the 3M Company of Minneapolis, Minn. In Examples I, III, and IV, isopropylthioxanthone and ethyl dimethylaminobenzoate were used as photoinitiator and photosensitizer. In Example II, Igracure 651 was used, which is a photoinitiator, available from Ceiba-Geigy Company of Hawthorne, N.Y.

All of the examples were preferable to the dielectric of Small in that thermal cycling from $-40°$ C. to $150°$ C. of more than two hundred cycles, without cracking, was achieved by all of them. Example I substantially constitutes the preferred embodiment of Table I. The improved performance of the photodefinable dielectric of Example I is summarized on Table II, and compared to the Small mixture.

TABLE II

| Parameter | Device Requirement | Small Mixture | Example I Mixture |
| --- | --- | --- | --- |
| Tg | 130° | 150–190° C. | 170–210° C. |
| Thermal Stability | | | |
| Long Term | 100° C. | 180° C. | 180° C. |
| Spikes | 300° C. | pass | pass |
| Dielectric Const. | <4 | 3.4–3.6 | 2.9 |
| TaN Compatibility | yes | yes | yes |
| Via Resolution | 3 mil | 3 mil | 2 mil |
| Leakage Current | <1 µA | <1 µA | <1 µA |
| Thermal Cycle $-40$–$140°$ C. | 5 | 50 | 200 |

TaN compatibility refers to the compatibility with tantalum nitride resistor patterns. TaN is thermally stable only up to 250° C.; consequently, the cure temperature of the polymer should be lower than this temperature. The Example I mixture is improved in that the dielectric constant is desirably reduced to 2.9, as well as having better thermal cycling and via resolution attributes. Various other embodiments and modifications can be made by those skilled in the art without departing from the spirit and scope of the invention.

We claim:

1. A method for making a circuit device comprising the steps of:
    applying a mixture to a substrate;
    solidifying at least part of the mixture to form a solid film layer;
    and using the film layer as a dielectric;
    wherein said mixture comprises from twenty to sixty weight percent of triazine and from one to ten weight percent of siloxane-caprolactone copolymer.

2. The method of claim 1 wherein:
    said mixture comprises zero to ten percent by weight of novolak epoxy acrylate.

3. The method of claim 2 wherein:
    the mixture comprises two to eight percent by weight of bis phenol-A diglycidyl ether monoepoxyacrylate, zero to twenty percent by weight of carboxyl-terminated butadiene nitrile, two to six weight percent of N-vinylpyrrolidone, one to ten weight percent trimethylolpropanetriacrylate, zero to five weight percent glycidoxypropyltrimethoxysilane, 0.05 to five weight percent photoinitiator, zero to two weight percent pigment, 0.1 to one weight percent surfactant, zero to 0.3 weight percent copper benzoylacetonate, and thirty to fifty weight percent solvent.

4. The method of claim 3 wherein:
    the step of solidifying the mixture comprises the step of irradiating the mixture with light.

5. The method of claim 4 wherein:
    the light includes a wavelength of about three hundred sixty-five nanometers.

6. The method of claim 1 wherein:
    the step of solidifying the mixture comprises the step of irradiating the mixture with light.

7. The method of claim 6 further comprising the steps of:
    selectively removing by means of a solvent portions of the mixture that have not been irradiated with light.

8. The method of claim 1 wherein:
    the mixture comprises zero to twenty weight percent of a multifunctional oligomeric acrylate.

* * * * *